United States Patent [19]

Wells

[11] Patent Number: 4,785,189
[45] Date of Patent: Nov. 15, 1988

[54] METHOD AND APPARATUS FOR LOW-ENERGY SCANNING ELECTRON BEAM LITHOGRAPHY

[75] Inventor: Oliver C. Wells, Yorktown Heights, N.Y.

[73] Assignee: International Business Machines Corporation, Armonk, N.Y.

[21] Appl. No.: 159,459

[22] Filed: Feb. 19, 1988

Related U.S. Application Data

[63] Continuation of Ser. No. 728,122, Apr. 29, 1985, abandoned.

[51] Int. Cl.[4] .......................................... H01J 37/317
[52] U.S. Cl. .............................. 250/492.2; 250/492.3; 250/423 F
[58] Field of Search ............ 250/492.21, 492.3, 492.1, 250/492.2, 306, 423 F

[56] References Cited

U.S. PATENT DOCUMENTS 4,343,993  8/1982  Bennig et al. ...................... 250/306
4,550,257  10/1985  Bennig et al. .................... 250/492.2

OTHER PUBLICATIONS

Bennig et al., "Surface Studies by Scanning Electron Microscopy," Rev. Phys. Lett., vol. 49, pp. 57-61, (1982).
Bennig et al., "Tunneling Through a Controllable Vacuum Gap," Appl. Phys. Lett., vol. 40, pp. 178-180, (1982).
Young, R. D., "Field Emission Ultramicrometer," Rev. Sci. Inst., vol. 37, pp. 275-278, (1966).

Primary Examiner—Bruce C. Anderson
Assistant Examiner—Paul A. Guss
Attorney, Agent, or Firm—Ronald L. Drumheller; Jackson E. Stanland

[57] ABSTRACT

An electron sensitive surface is patternized treated to a high resolution pattern of low-energy electrons without any need to do focussing by emitting the low-energy electrons from a pointed electrode and positioning the apex of the pointed electron emitting source suitably close to the surface being treated.

10 Claims, 1 Drawing Sheet

METHOD AND APPARATUS FOR LOW-ENERGY SCANNING ELECTRON BEAM LITHOGRAPHY

DESCRIPTION

This is a continuation of application Ser. No. 728,122, filed 4-29-85, now abandoned.

TECHNICAL FIELD

This invention relates to high resolution electron beam lithography methods for manufacturing microcircuitry and more particularly to a high resolution method for patternwise exposing a surface to low energy electrons.

BACKGROUND OF THE INVENTION

Photo-lithography is the conventional lithographic method used for manufacturing miniaturized electronic circuits. In this method, a photoresist layer having a predetermined thickness is deposited upon a surface, usually a semiconductor wafer surface. The deposited resist layer then is patternwise exposed, typically by irradiating it with light through a mask which carries the pattern of the circuitry to be formed. The exposed resist layer is then developed. Photo-lithography has a resolution (the smallest size which can be defined) limited by diffraction effects, which are in turn related directly to the wavelength of the light used for making the exposure.

Higher resolution is available by using electron beam lithography. In electron beam lithography, a deposited electron-sensitive resist layer is patternwise exposed, typically using a scanning electron beam that is turned on and off so as to form an exposure image in the resist which corresponds to the circuitry desired. The electron beam exposed resist is then developed. In scanning electron beam lithography, resolution is limited chiefly either by electron scattering effects in the material being irradiated (if the beam diameter is small enough) or by the diameter of the electron beam (if the beam diameter is too large).

The need for high-performance integrated circuits, memories and similar devices requires ever finer resolution in the lithographic processes. Although it has been realized in theory that electron scattering effects may be reduced by lowering the energy of the electrons in an electron beam, the minimum achievable beam diameter in conventional electron beam machines increases as the energy of the electrons in the beam is reduced because of chromatic aberration in the magnetic and/or electronic lenses, among other causes. Consequently, as the energy of the electrons in a conventional electron beam is reduced, the resolution actually deteriorates rather than improves as a result of the increasing beam diameter even though electron scattering itself becomes less of a problem.

SUMMARY OF THE INVENTION

An object of the present invention is to provide an improved electron beam lithography method for creating an exposure pattern having unprecedented resolution in an electron sensitive surface.

This is accomplished in accordance with this invention by patternwise treating an electron sensitive surface to a high resolution pattern of low-energy electrons rather than high-energy electrons.

As previously pointed out, this cannot be done with conventional electron beam apparatus, since low-energy electron beams cannot be focussed to form a suitably small diameter beam of practical electron density. In accordance with this invention, however, a small area of the electron sensitive surface is irradiated with low-energy electrons without any need to do focussing by emitting the low-energy electrons from a pointed electrode and positioning the apex of the pointed electron emitting source suitably close to the surface being treated.

An electron emitting pointed electrode is physically scanned in close proximity to an electron sensitive surface. The voltage between the surface and the electron emitting point is maintained at less than 1000 volts (preferably less than 10 volts) so that low-energy electrons are emitted from the point and travel toward the electron sensitive surface.

When the separation between the pointed electrode and the surface being treated is less than about 1 nm, the electron clouds of the atoms at the apex of the pointed electrode and at the surface opposite the apex touch, and a tunnel current path is established between the apex of the pointed electrode and the surface. When the separation is more than about 3 nm, electrons must leave the pointed source via field emission. When the separation is between about 1 and 3 nm, both current effects are experienced. In any case, the area of the surface receiving the electrons has a diameter roughly equal to the distance between the point source of the electrons and the target surface.

Low energy electrons have been emitted from a point electron source positioned close to a surface in the Scanning Tunneling Microscope, described by G. Binnig et al., for example, in the article entitled, "Surface Studies by Scanning Tunneling Microscopy", 49 Phys. Rev. Lett. 57–61 (1982), and in the article entitled, "Tunneling Through a Controllable Vacuum Gap," 40 Appl. Phys. Lett. 178–180 (1982), and in U.S. Pat. No. 4,343,993, all of which are hereby incorporated by reference. Low energy electrons have also been emitted from a point electron source positioned close to a surface by the apparatus described by R. D. Young in "Field Emission Ultramicrometer", 37 Rev. Sci. Instrum. 275–278 (1966). Since certain physical parts of the apparatus described in these references also may be used (with modification) to practice this invention, these references are all hereby incorporated by reference.

While it may be observed in retrospect that these prior art devices irradiate a small surface area with low-energy electrons, these devices were not used to do lithography but rather were used to measure distance, height or work function. In the present invention low-energy electrons are being applied patternwise to a surface which is electron sensitive for the purpose of creating a corresponding exposure pattern. The specimen being irradiated in the prior art devices was not electron sensitive and the irradiation was not applied in a pattern. In the prior art devices, the effect that the proximate surface had upon the emission characteristics of the source was used to control or measure the position of the electron source with respect to the surface for the purpose of measuring the position or height of the proximate surface. No known prior art appears to use a point electron source positioned very close to a surface for the direct purpose of chemically modifying a small area of the surface itself with low-energy electrons rather than detecting the position or height of the surface.

DESCRIPTION OF THE PREFERRED EMBODIMENTS

Figure 1:
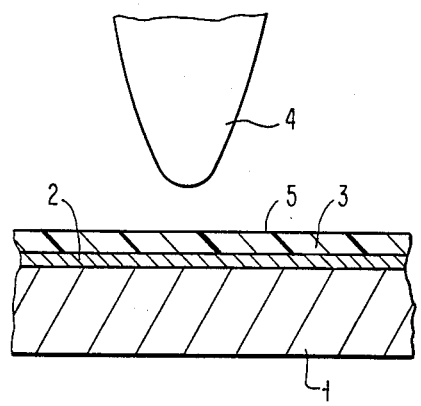
FIG. 1 schematically shows an electron-emitting pointed electrode spaced from a resist layer carried by a substrate which has been coated with a layer of electrically conductive material.

Referring now to FIG. 1, a workpiece 1 is shown, which may be a semiconductor wafer, for example, the surface of which is to be modified so as to yield a microstructure of electronic circuitry. The contemplated modification may involve etching, diffusion of dopants, deposition of material, etc., all to correspond to a desired pattern as dictated by the electronic circuitry or material characteristics to be generated. Substrate 1 is coated with a conductive layer 2 which in turn carries a resist layer 3 which is sensitive to irradiation by electrons. Depending upon the particular manufacturing step intended, the resist material may be either of the positive or the negative type. For example, if a positive resist is used, the areas thereof irradiated with electrons will polymerize. This enables these areas to remain on the substrate after the development process while the areas not exposed to the electrons are dissolved thus exposing these areas to the next manufacturing step, such as etching.

As will become more apparent as this description proceeds, the resist coating 3 will be patternwise irradiated with low-energy electrons, which should be able to travel to an amplifier for control of the separation between the resist coating surface and the electrode 4. Conductive layer 2 may serve to carry the electron current to a conductive lead connected to the amplifier. Layer 2 may or may not have additional functions. For example, layer 2 may be a metal layer intended to be patterned by etching using a patterned resist layer fabricated in accordance with this invention. Alternatively layer 2 could be a plating base. If layer 2 is not needed for some other purpose, alternative methods of getting the electron current to the amplifier could be used in place of an underlying conductive layer.

Figure 2:
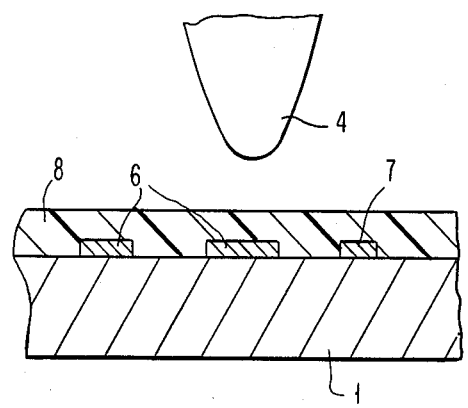
FIG. 2 shows a pointed electrode above a resist-coated substrate which already carries a conductor pattern fabricated in an earlier process.

For example, a thin conductive layer could be placed on top of the resist instead of under it. If the conductive layer is thin enough, electrons will travel through the thin conductive layer and image the resist under it. Alternatively, the conductive layer can be avoided entirely if either the resist or the underlying substrate is suitably conductive. Furthermore, the conductive layer may either be continuous, as illustrated in FIG. 1, or patterned, as illustrated in FIG. 2.

In contrast to the conventional method of irradiating the resist layer 3 with electrons, which uses apparatus similar to an electron microscope with an electron gun and electrostatic and/or magnetic lenses for beam deflection, in accordance with the present invention a very sharp electrode 4 is brought very close to the top surface 5 of resist layer 3. The distance between the electrode tip and the top surface 5 may be on the order of one to ten nanometers, for example.

To generate an exposure pattern in resist layer 2 corresponding to the circuitry to be manufactured, electrode 4 is scanned across layer 2. The scanning may be done either in a raster scan mode of operation or in a vector scan mode of operation. In either event, the dose of electrons provided by electrode 4 to the layer 2 must be relatively much greater in the regions of layer 2 where exposure is desired than in regions where exposure is not desired. Preferably the flow of low-energy electrons is completely interrupted while the electrode scans across an area where no exposure is desired. As will become apparent, however, in the preferred mode of operation the separation of the electrode and surface is controlled in response to the voltage and/or current flow across the gap between the electrode and surface. When the flow of low-energy electrons is interrupted, the separation between the electrode and the surface cannot be sensed (at least not in this preferred way). Various approaches can be used to overcome this conflict.

One possible approach (the one ordinarily preferred and the one shown in FIG. 3) is that the separation sensing be done only during such times that the low-energy electrons are flowing and that at other times the height of the surface and therefore the separation is assumed to be constant. It is possible also to gradually withdraw the electrode slowly when electron current is not flowing to guard against the separation becoming too small accidentally due to a gradual increase in height of the surface.

Another approach is to reduce the electron dose in the areas where exposure to electrons is not desired but to still allow electron flow for the purpose of controlling the separation. The electron dose can be lowered to a value which is the effective equivalent of no dose in several different ways. One way is to increase the scan speed when the electrode passes over areas which are to receive no exposure. At a higher scan velocity the electron dose will be lowered even if the electron flow is held constant for the separation control system.

Another way of effectively lowering the exposure dose in the regions where minimum exposure is desired is to reduce the current flow to a lower amount while the electrode tranverses those regions and simultaneously effectively modifying the separation control system during these times, say by compensating for the lower signal level by selectively increasing either the gain or changing the DC offset of the amplifier in the control loop.

In theory it is also possible to withdraw the electrode tip itself to reduce the exposure dose. Since the electron flow will then be spread over a larger surface area when the electrode to surface separation is increased, it would be possible to thus reduce the dose while still maintaining the same total current flow, much as when the scan speed is changed to accomplish a similar effect. It is also possible to reduce the total current flow simultaneously and to electronically compensate for the change in the sensed signal level as previously described.

In contrast to conventional electron beam lithography apparatus where an electron beam is scanned across a surface by deflecting the beam with a magnetic or electric field, in apparatus in accordance with this invention the electron emitting source itself is mechanically scanned. Electrode 4 is mechanically scanned across the resist layer 3 by physically moving the electrode in the X-Y directions relative to the layer. The position of the electrode in the Z direction relative to the surface must also be controlled. It should be apparent that either the electrode can be moved or the surface can be moved, or both. Mechanical drive mechanisms suitable for accomplishing this are well known in the art and do not form a part of the present invention. Yet to ease understanding, a brief description of a preferred embodiment of the mechanical scanning system will be described.

Since a semiconductor wafer typically has a diameter between 2.5 and 25 cm, while the conductors, transistors, resistors and other structures which one might like to create on the semiconductor wafer might have an intended minimum size on the order of tens of nanometers, the scanning system should have a range on the order of 10 cm with a desired resolution of about 1 nm. To meet these requirements, separate mechanical positioners must be used to provide large and small motions. Any simple or convenient coarse positioning mechanism can be used, such as for example lead screws. Fine X-Y positioners which meet these requirements also have been described in the prior art, such as the one shown in IBM Technical Disclosure Bulletin, Vol. 26, No. 10A, March 1984, p. 4898-99 or in the Binnig references cited earlier. These and other similar fine positioners employ piezoelectric elements which undergo minute contractions or expansions in response to the application of potentials to electrodes arranged on opposite sides of these elements.

In carrying out the method of the present invention it is rather important to maintain the electron emitting point 4 at an essentially constant distance from the surface 5 of electron sensitive layer 3. As already described, the distance between the surface 5 and the electrode 4 is preferably on the order of nanometers. It is generally known in the art of scanning tunneling microscopy (for example from the Binnig references previously cited) how to control the distance or separation between a pointed electron emitting tip and a closely adjacent surface by monitoring the electron current flowing between the electrode and the surface or the voltage therebetween and using the monitored variable to control a servo-mechanism, such as a piezoelectric drive.

Figure 3:
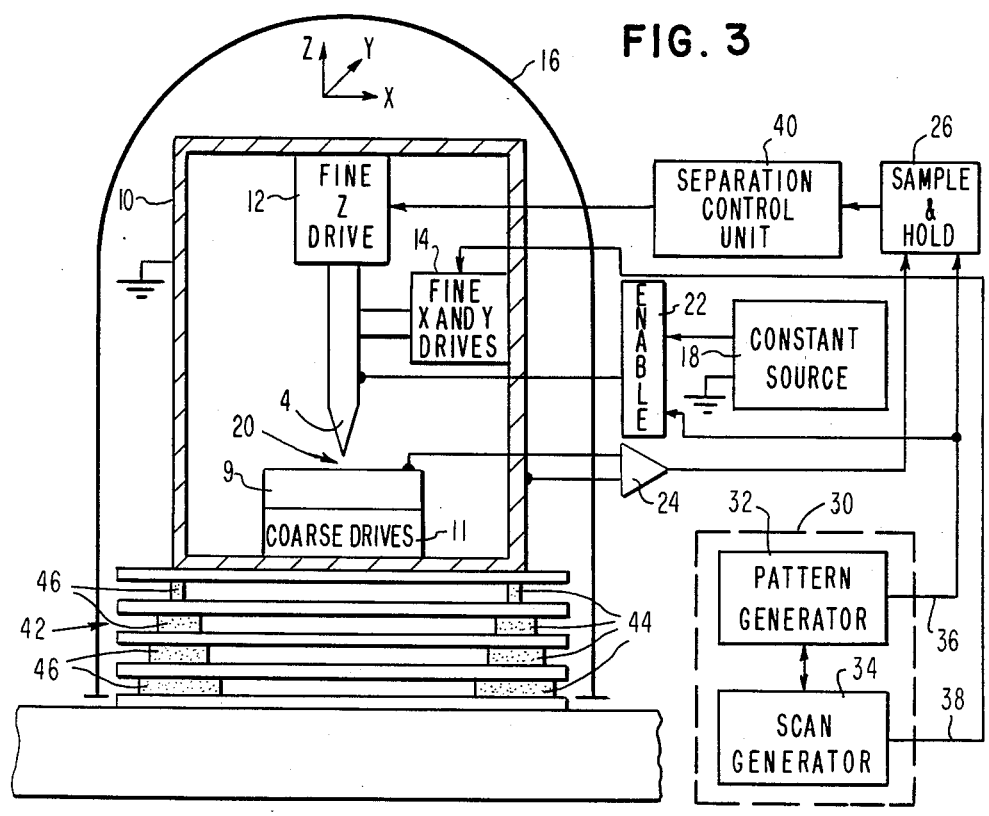
FIG. 3 is a schematic representation of apparatus for carrying out the method of this invention.

Referring now specifically to FIG. 3, a coarse drive means 11 carries and is used to coarsely position a workpiece 9 having an electron sensitive top surface. A fine Z-direction drive 12, fine X-Y direction drives 14 and the coarse drives 11 are all supported from a common frame 10 within a vacuum chamber 16. Constant source 18 maintains either a constant voltage or a constant current across a small gap 20 separating the electron emitting point source 4 and the target 9 whenever exposure is desired. The flow of current across gap 20 is turned off and on via a switching gate enable means 22.

In the preferred constant voltage mode of operation, the potential of electrode 4 is maintained by source 18 at about 0.5 to about 10 volts negative with respect to the potential of the electron sensitive workpiece 9 whenever pattern writing is done (i.e. the surface of workpiece 9 is being exposed to low-energy electrons). At other times the voltage across gap 20 is reduced substantially to zero so that the current flow across gap 20 also falls to substantially zero. The current across gap 20 is continuously sensed by an amplifier 24 electrically connected to the electron sensitive surface of workpiece 9. The current flow sensed by amplifier 24 is a measure of the separation between electrode 4 and sample 20 when the electrode 4 is energized by source 18 via enable 22.

The pattern to be written is stored in a computer 30, which includes a pattern generator 32. Pattern generator 32 converts the stored pattern into a signal on line 36 that is correlated with scan signals from generator 34 on lines 38. Lines 38 represent separate signal lines for X and Y scan signals. The signals are related such that a desired pattern is generated by turning on a writing or exposure mechanism in accordance with the signal on line 36 at a position determined by the scan signals on lines 38. Apparatus which performs this function is well known since the same function is performed whenever a pattern is generated by a computer whether it is to form an image on a display or an exposure pattern with a conventional electron beam exposure system. The signals on lines 36, 38 may be formed in any known conventional manner.

The scan generator signals are used to mechanically scan the position of the electrode 4 with respect to the workpiece 4 via drives 14. The pattern generator signal is used to turn the current flow mechanism across gap 20 on and off in accordance therewith and also to disable any change in the Z position of the electrode 4 whenever the current flow across gap 20 is interrupted. The pattern generator signal on line 36 is used to control the enable gate 22 so that source 18 causes flow of current across gap 20 only during such times that exposure of workpiece 9 is desired. Simultaneously, the pattern generator signal is used to control a sample and hold circuit means 26 so as to enable the feedback signal from amplifier 24 to be used only when current flow across gap 20 is enabled by gate 22. Whenever gate 22 interrupts flow of current across gap 20, sample and hold circuit 26 maintains the last current value sensed by amplifier 24, which is a direct (though inverse) measure of the separation between electrode 4 and workpiece 9. Separation control unit 40 responds to the sensed separation between electrode 4 and workpiece 9 and controls the Z position of electrode 4 via drive 12 in response thereto so as to maintain a substantially constant separation. Control systems which accomplish this function were described, for example, by Binnig in the references cited earlier.

In view of the fact that electrode 4 is scanned over the workpiece surface at a separation possibly in the nanometer range, and that the resolution attainable with a piezoelectric X-Y translation mechanism also is on the same order of magnitude, it is important that the electrode 4 and the workpiece 9 be isolated from external sound and vibration. This may be achieved, for example by mounting everything inside of vacuum chamber 16 on a damped suspension apparatus 42. The damped suspension apparatus may simply consist of a stack of plates 44 separated by elastic members 46. In order to provide for absorption of vibrations of different frequencies, the cross-sections and/or elasticities of the elastic members 46 may vary along the stack.

After the workpiece 9 with an electron sensitive surface has been patternwise exposed to low-energy electrons so as to create an exposure pattern in the surface, it may be further processed by any of the existing lithographic techniques. If the electron sensitive surface is a resist surface, the exposure pattern ordinarily would be developed into a physical relief pattern in some conventional fashion, such as by contacting the surface with a developer solution. The developed relief pattern can be used for any conventional purpose, such as for on etching of material which lies under the relief pattern or for lift-off of a layer deposited over the relief pattern. It is also possible to manufacture multilayered structures by repeating the individual process steps.

In comparison to conventional electron beam techniques, the method in accordance with this invention requires only very low electron energies, which leads to very small line widths. For example, if an electron energy of some tens of eV is needed to expose an electron sensitive photoresist, then a line width of only a few nanometers can be produced, which is considerably smaller than can be obtained with conventional electron beam lithography at the present time.

It will be clear to those skilled in the art that the method in accordance with this invention is compatible with existing image registration techniques in which a structure or structures already present on the substrate can be located by using an electron emitting probe, and then employing the same probe to define an image in an electron sensitive layer for a subsequent manufacturing step.

FIG. 2 shows a semiconductor wafer substrate 1 with several conductive lines 6 of a circuit pattern and a conductive alignment mark 7, all manufactured in previous steps. Substrate 1 and conductive lines 6, 7 have then been covered with a photoresist layer 8. By applying a potential between the alignment mark 7 and the electron emitting pointed electrode 4, it will be possible to precisely register the semiconductor wafer with nanometer accuracy by detecting the electron current flowing from electrode 4 to mark 7 as electrode 4 scans across the mark 7.

As mentioned earlier, the minimum line width achievable depends on the separation between the electrode 4 and the surface of the substrate 1. The thickness of an electron sensitive layer on a substrate also may affect the minimum achievable line width. Any conventional method of forming a thin electron sensitive layer on a substrate may be used. It is possible, for example, to form a pinhole-free polymer film of about 10 nm thickness by irradiating monomer layers with ultraviolet light. The monomer film can be deposited upon the surface of a substrate from a gas containing organic vapor. Photoresist layers from 1 to 10 molecular layers in thickness also can be formed by the classical Langmuir-Blodgett process, which consists of spreading a monolayer of polymer molecules on an aqueous surface, compressing the monolayer into a compact floating film, and transferring it to the substrate by passing the substrate through the water surface.

While a specific embodiment of this invention has been described it should be apparent to those of ordinary skill that certain changes and modifications can be made without departing from the spirit and scope of this invention as defined in the following claims.

Having thus described my invention, what I claim as new and desire to secure by Letters Patent is:

1. A lithographic apparatus for exposure of an electron-sensitive resist layer by low energy electrons, said apparatus comprising:
   a workpiece spaced from a pointed electrode,
   an electron-sensitive resist layer having a thickness of at least about 10 nm located on said workpiece, said resist layer facing said pointed electrode,
   electron exposure means for providing low energy electrons to chemically modify selected areas of said resist layer to create a pattern of exposed regions therein, said electron means including:
   a pointed electrode the apex of which points towards said electron-sensitive resist layer,
   means for providing a flow of electrons having energies less than 1000 eV from said pointed electrode to said electron-sensitive resist layer,
   means for scanning said pointed electrode with respect to said workpiece, and
   means for positioning said pointed electrode a distance from said electron-sensitive resist layer not exceeding 1000 nm.

2. Low-energy electron beam apparatus as defined in claim 1 wherein said workpiece is spaced from said electrode by a distance of about 1 nanometer.

3. Low-energy electron beam apparatus as defined in claim 1 wherein said electron exposure means comprises means for controlling said means for providing a flow of electrons.

4. Low-energy electron beam apparatus as defined in claim 1 wherein said electron exposure means comprises means for selectively reducing the flow of low-energy electrons to said workpiece.

5. Low-energy electron beam apparatus as defined in claim 4 wherein said means for selectively reducing the flow of low-energy electrons to said workpiece comprises means for selectively withdrawing said pointed electrode away from said workpiece.

6. Low-energy electron beam apparatus as defined in claim 4 wherein said electron exposure means comprises means for selectively reducing the voltage applied between said electrode and said resist layer during such times that the flow of low-energy electrons to said resist layer is to be reduced.

7. Low-energy electron beam apparatus as defined in claim 1 wherein said electron exposure means comprises means for selectively interrupting the flow of low-energy electrons to said resist layer.

8. Low-energy electron beam apparatus as defined in claim 7 wherein said means providing a flow of electrons comprises voltage source means electrically connected between said electrode and said resist layer except during such times that flow of low-energy electrons to said resist layer is interrupted.

9. Low-energy electron beam apparatus as defined in claim 1 wherein the separation between said poitned electrode and said resist layer is maintained substantially constant.

10. Low-energy beam apparatus as defined in claim 9 wherein said apparatus is feedback controlled during the time that flow of electrons is not interrupted.

* * * * *